United States Patent
Hanna

(10) Patent No.: US 6,542,844 B1
(45) Date of Patent: Apr. 1, 2003

(54) METHOD AND APPARATUS FOR TRACING HARDWARE STATES USING DYNAMICALLY RECONFIGURABLE TEST CIRCUITS

(75) Inventor: Stephen Dale Hanna, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 09/631,130

(22) Filed: Aug. 2, 2000

(51) Int. Cl.[7] .............................................. G01R 19/00
(52) U.S. Cl. ...................... 702/120; 702/120; 702/119; 702/122; 702/184; 714/724; 714/725; 714/734
(58) Field of Search ................................. 702/118, 119, 702/120, 121, 122, 108, 117, 123, 124, 126; 714/39, 725

(56) References Cited

U.S. PATENT DOCUMENTS

| | | | |
|---|---|---|---|
| 4,435,759 A | * 3/1984 | Baum et al. .................. | 714/44 |
| 4,847,839 A | 7/1989 | Hudson, Jr. et al. | |
| 5,101,151 A | 3/1992 | Beaufils et al. | |
| 5,384,275 A | 1/1995 | Sakashita ..................... | 326/38 |
| 5,475,624 A | 12/1995 | West ............................ | 703/15 |
| 5,497,498 A | * 3/1996 | Taylor ......................... | 710/104 |
| 5,499,192 A | 3/1996 | Knapp et al. ................. | 716/17 |
| 5,596,742 A | 1/1997 | Agarwal et al. .............. | 716/16 |
| 5,613,061 A | 3/1997 | Taylor | |
| 5,640,107 A | 6/1997 | Kruse .......................... | 326/38 |
| 5,654,650 A | 8/1997 | Gissel ......................... | 326/38 |
| 5,673,198 A | 9/1997 | Lawman et al. .............. | 716/11 |
| 5,706,300 A | 1/1998 | Wedel | |
| 5,812,414 A | 9/1998 | Butts et al. .................. | 716/16 |
| 5,835,751 A | 11/1998 | Chen et al. .................. | 716/16 |
| 5,844,917 A | 12/1998 | Salem et al. | |
| 5,946,219 A | 8/1999 | Mason et al. ................. | 716/16 |
| 5,963,735 A | 10/1999 | Sample et al. ............... | 703/24 |
| 5,978,862 A | 11/1999 | Kou et al. .................... | 710/14 |
| 6,003,150 A | 12/1999 | Stroud et al. ................ | 714/725 |
| 6,016,563 A | * 1/2000 | Fleisher ....................... | 714/725 |
| 6,026,226 A | 2/2000 | Heile et al. .................. | 716/12 |
| 6,286,114 B1 | * 9/2001 | Veenstra et al. ............. | 714/39 |

OTHER PUBLICATIONS

Rosenberg, Joel, "Reconfigurable FPGA's Dual Role: In–System Test and System Level Logic," Northcon 94 Conference Record, Oct. 11–13, 1994, pp 226–229.

* cited by examiner

Primary Examiner—Marc S. Hoff
Assistant Examiner—Elias Desta
(74) Attorney, Agent, or Firm—Bracewell & Patterson, LLP; Scott W. Reid

(57) ABSTRACT

A method and apparatus for tracing hardware states using dynamically reconfigurable test circuits provides improved debug and troubleshooting capability for functional logic implemented within field programmable logic arrays (FPGAs). Special test logic configurations may be loaded to enhance the debugging of a system using FPGAs. Registers are used to capture snapshots of internal signals for access by a trace program and a test multiplexer is used to provide real-time output to test pins for use with external test equipment. By retrieving the hardware snapshot information with a trace program running on a system in which the FPGA is used, software and hardware debugging are coordinated, providing a sophisticated model of overall system behavior. Special test circuits are implemented within the test logic configurations to enable detection of various events and errors. Counters are used to capture count values when system processor execution reaches a hardware trace point or when events occur. Comparators are used to detect specific data or address values and event detectors are used to detect particular logic value combinations that occur within the functional logic.

10 Claims, 5 Drawing Sheets

METHOD AND APPARATUS FOR TRACING HARDWARE STATES USING DYNAMICALLY RECONFIGURABLE TEST CIRCUITS

BACKGROUND OF THE INVENTION

1. Technical Field

The present invention relates generally to built-in test circuits implemented in field programmable gate arrays (FPGAs), and more specifically to a method and apparatus for tracing hardware states within an FPGA.

2. Description of the Related Art

Field Programmable Gate Arrays (FPGAs) provide flexibility in implementing logic designs by allowing reconfiguration of logical circuits via download of binary information. Recent developments in FPGA technology have led to the availability of FPGAs with over 100,000 gates or more within a single Integrated Circuit (IC) package.

FPGAs are frequently used in dedicated peripherals attached to computer systems, particularly in graphics applications, where their high speed and reconfigurability yield an advantage. For example, graphics display electronics and printer graphics electronics that convert bit-plane information into serial data streams have been implemented using the FPGA technology. Because microprocessors and microcontrollers are not efficient for the high-speed serialization/de-serialization of bitstreams, dedicated very-large-scale integrated (VLSI) circuits are used for this purpose. The VLSI circuits are typically gate arrays, having a mask that is designed once and never modified until another version of the VLSI circuit is designed and verified. VLSI circuits have a high non-recurring engineering (NRE) cost for mask design and production tooling. FPGAs provide an alternative solution having advantages including quick design and modification turn-around and reconfigurability.

Since the FPGA designs can be quickly modified during the design process and for version upgrades, and since alternate logic configurations may be supported, a method that matches the short design turn cycle (in many cases less than one hour) to the verification and debugging process would be desirable. It would also be desirable to allow for field debugging in cases where there may be a quick solution to a field site problem by modifying the logic, but no ready way to verify the low-level behavior of a new logic design in the field.

Due to the complexity of circuits that can be implemented in a present-day FPGA, there is a need to provide measurement of intermediate signals within the FPGA, but without using a significant number of an FPGA's Input/Output (I/O) pins from the FPGA.

Therefore, it would be desirable to provide a method and apparatus for tracing logic states within an FPGA, and further provide for field testing and design debugging of computer peripherals using FPGAs in their implementations.

SUMMARY OF THE INVENTION

The above-mentioned objectives are achieved in a method and apparatus for tracing hardware states within functional logic using dynamically reconfigurable test circuits. One or more sets of reconfigurable test circuits are used to make measurements for debugging and troubleshooting. A particular test circuit can be selected by a software tracing program and test information may be read from the test circuit by a microcontroller or microprocessor. This information can be synchronized with software trace information, providing a unified trace history of software and hardware. The test circuits may incorporate counters, event detectors, comparators and other miscellaneous test circuits that enable design engineers or field service personnel to determine more readily the cause of problems within the functional logic or software.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF AN ILLUSTRATIVE EMBODIMENT

Figure 1:
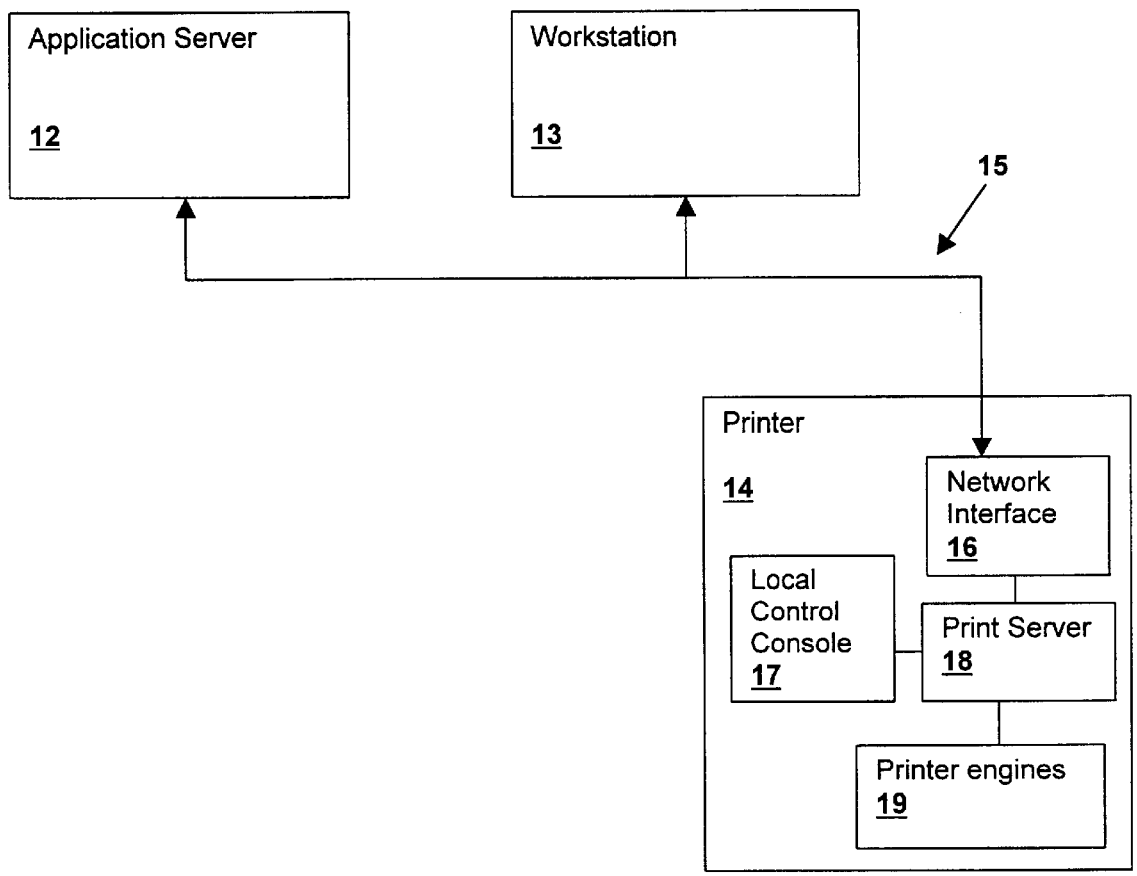
FIG. 1 is a block diagram of a computer network having a network compatible printer, in which a preferred embodiment of the present invention can be implemented.

With reference now to the figures, and in particular with reference to FIG. 1, there is depicted a block diagram of a computer network having a network compatible printer, in which a preferred embodiment of the present invention can be implemented. An application server 12 is coupled to a network 15 having a workstation 13 and a printer 14. Application server 12 may perform services requested by workstation 13, such as spooling a print request targeted at printer 14.

Within printer 14, a local control console 17 provides user interface capability for programming and otherwise, controlling operation of printer 14, including selection and display of special test modes in accordance with the present invention. Workstation 13 may also control test modes and trace formats via a network and interface 16 may also be used to display the results of the trace of the present invention. Network interface 16 provides the printer connection to network 15 and receives printer commands and graphics data, network interface 16 also returns printer status and query responses over network 15, including trace results in accordance with an embodiment of the present invention. A print server 18 acts as a server to network 15 and may perform all spooling functions, and other print support operations. Printer engines 19 embody the portions of printer 14 that control printing operations, convert graphics input data, control printhead/laser position and print state, etc.

Figure 2:
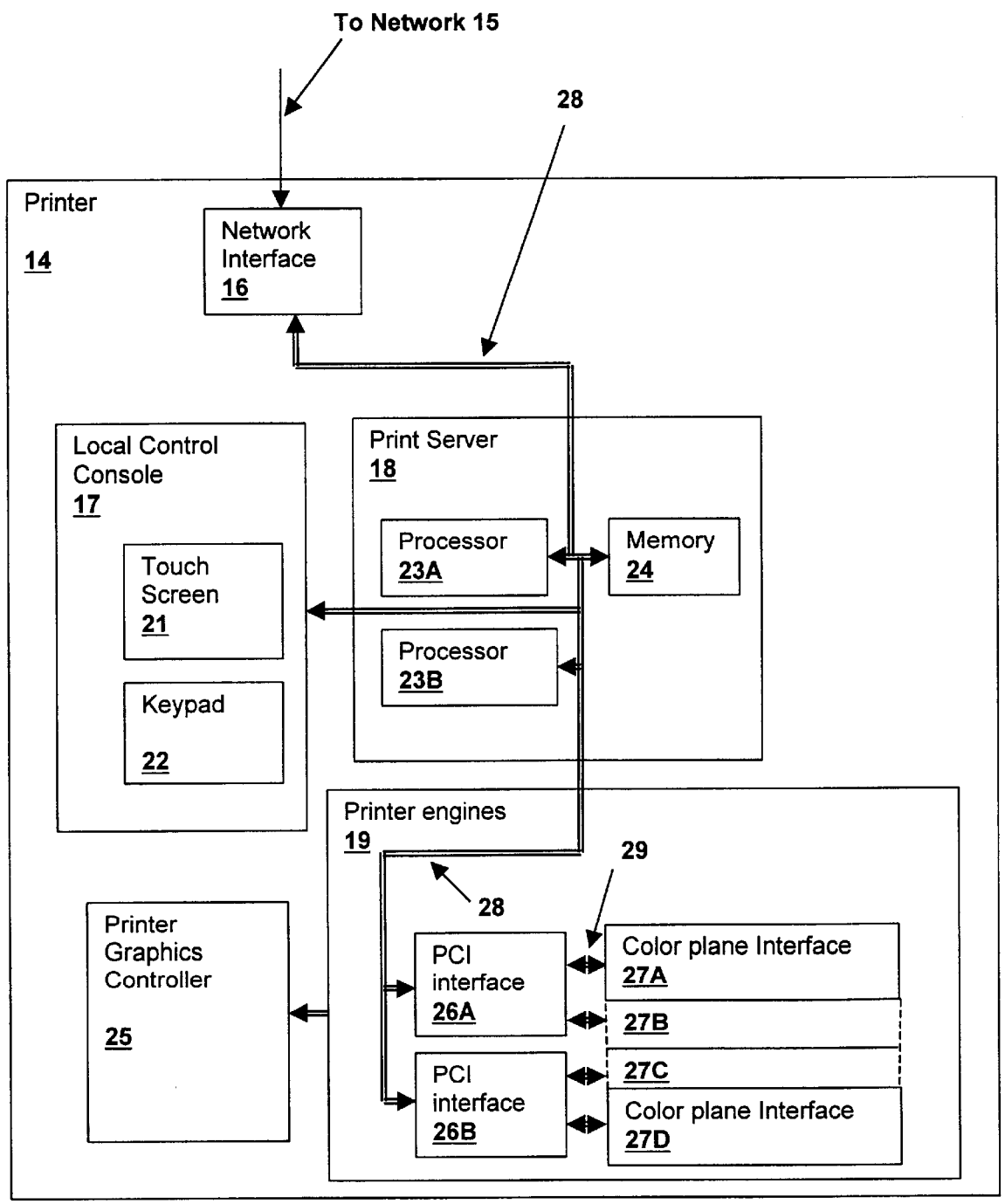
FIG. 2 is a block diagram of the network compatible printer from FIG. 1.

Referring now to FIG. 2 there is depicted a detailed block diagram of printer 14. Network interface 16 couples network 15 to processors 23A and 23B within print server 18. Processors 23A and 23B are coupled to a memory 24 that stores data and program instructions for use by processors 23A and 23B. PCI bus 28 couples processors 23A and 23B, memory 24 a local control console 17. Within local control console 17 are a touch screen 21 and a keypad 22 for controlling printer 14 operations.

Printer engines 19 contain color plane interfaces 27A–D in accordance with the preferred embodiment of the present invention. Color plane interfaces 27A–D are coupled to PCI bus 28 by PCI interfaces 26A and 26B. Printer engines 19 control printer graphics controller 25 to provide graphical output for driving a printhead of a laser printer, inkjet printer, etc.

Figure 3:
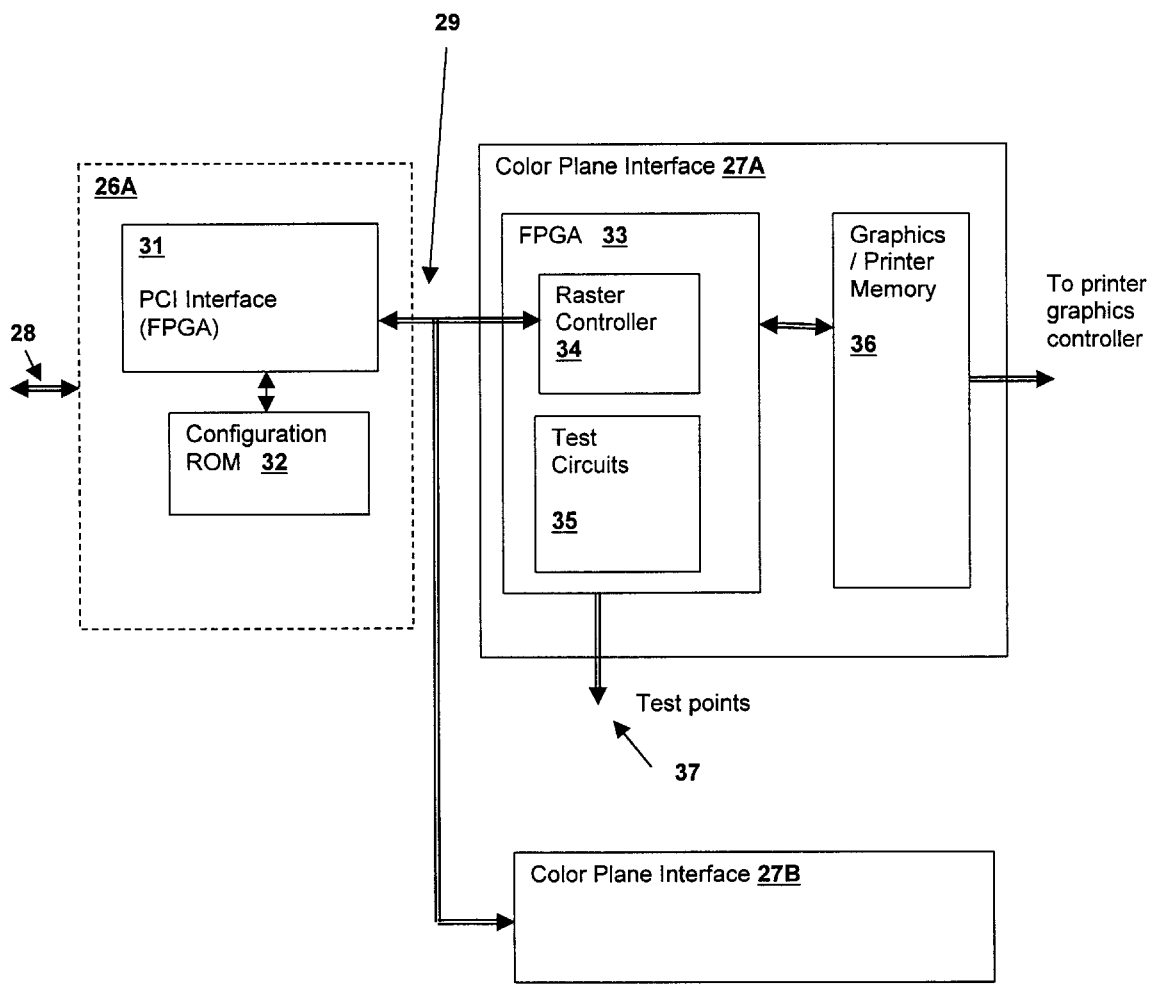
FIG. 3 is a block diagram of a PCI interface and color plane memory module within the network compatible printer of FIG. 2.

Referring now to FIG. 3, details of PCI interface 26A and color plane interface 27A of FIG. 2 are depicted. PCI interface FPGA 31 is configured at startup by Configuration ROM 32. The power-up configuration of PCI interface FPGA is pre-configured to read FPGA configuration information severally from configuration ROM 32. Once the configuration contained within configuration ROM 32 is loaded, PCI interface FPGA implements a PCI bus interface and may be further configured via this interface.

Color plane interface 27A, also contains an FPGA 33. FPGA 33 is configured by configuration image data sent to PCI interface 31 by processor 23A or 23B. When programmed with configuration data, FPGA 33 contains Test Circuits 35 as well as functional circuits such as Raster controller 34. Raster controller 34 interfaces graphics/printer memory 36 to PCI bus 23 via PCI interface 31, allowing Raster controller 34 to receive graphics data and convert it to data within graphics/printer-memory 36 for use by printer graphics controller 25. Test circuits, which have designs that vary by desired testing abilities, can be coupled to virtually any signal within Raster controller 34, allowing advanced testing, debug and monitoring of Raster controller 34.

Test points 37 are provided for real time external measurements of signals within FPGA 33, and results may also be returned to processors 23A and 23B via PCI interface 26A over PCI bus 28 for display of debug information to a user.

Figure 4:
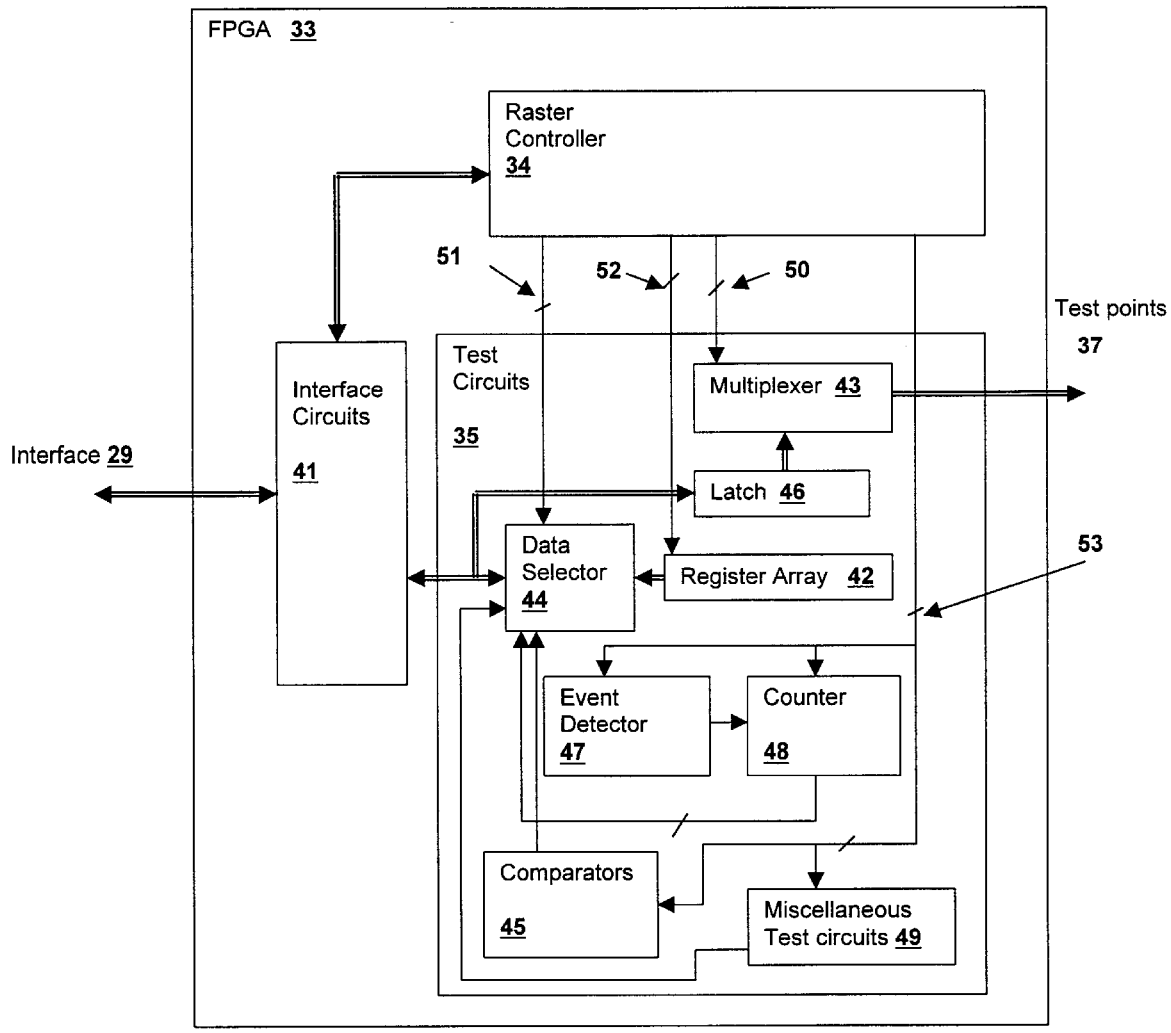
FIG. 4 is a block diagram of an FPGA implementing control circuits within the color plane memory module of FIG. 3, in accordance with a preferred embodiment of the present invention.

Referring now to FIG. 4, configuration of FPGA 33 in accordance with an embodiment of the present invention is depicted. Interface 29 is coupled to interface circuits 41, which provide means for PCI Interface 31 to communicate with Raster Controller 34. Internal signals 50, 51 and 52 from Raster Controller are coupled to test circuits 35. These test circuits may be varied as needed. Designs are produced via FPGA design software and binary image files are produced that may be stored within persistent storage coupled to network 15, embedded within program code within memory 24 or selected from a configuration ram that may be optionally coupled to FPGA 33. Depending on a desired particular test or debugging sequence or a level of trace output required (sparse vs. verbose), different configurations may be loaded into FPGA 33.

In the configuration of FPGA 33 depicted in FIG. 4, exemplary test circuits 35 are shown. Some elements may be common to all configuration images, while others are used for specific tests and debug operations. It is helpful during the debug/design phase of a peripheral device to build a library of these test circuits that can be later used for maintenance or field troubleshooting. Particular points can be selected from the functional logic and particular circuitry can be implemented withing test circuits 35 to allow troubleshooting to be a progressive process, with new configuration images developed for download to FPGA 33 until the information needed to solve a particular problem is available. A configuration providing less test detail about a particular portion of the functional logic, but general information about the entire operation of the functional logic is useful in the production cycle of a product containing test circuits in accordance with the present invention.

The information that is held in register array 42 and presented to interface 29 may also be varied as a function of error detection. For example, raster controller 34 may contain circuitry for detecting parity errors, graphics object sequence errors and graphics object type errors. Depending on the type of error detected, different subsets of internal signals 52 may be latched in register array 42. The selection of the particular signals is based upon the type of error, in order to present the most useful information for that type of error, or all of internal signals 52 can be latched and the output format of the trace program varied to display the information in a form that assists in determining the cause of an error. The trace program output can also be transmitted over network 15, allowing remote debugging. An Internet connection might be used to provide a graphical or text interface accessible from an Internet or intra-net connection.

Data selector 44 interfaces direct signals 51 from the functional logic (Raster Controller 34) as well as data from register array 42, which can provide static versions of signals 52 from Raster Controller 34. Data selector 44 also selects data from specialized test circuits such as comparators 45, counter 48, as well as other miscellaneous test circuits 49. Comparators 45, provide a means for determining when specific values occur, for example producing an output when a particular data value or address is processed by Raster Controller 34. Event Detector 47 may detect a particular combination of logic signals 53 from Raster Controller 34. Counter 48 can be configured to count how many events detectable by event detector 47 have occurred, or may count transitions of some other clock signal, such as a data strobe between events, such as a parity error. Counters are also useful for determining the source of errors that are data dependant. For example, counters may be implemented within test circuits 35 to determine which graphics object is being processed by raster controller 34 and precisely which values within the graphics object are being processed when the error occurs.

The output of data selector 44 is provided through interface circuits 41 to interface 29. The values selectable by data selector 44 can thus be accessed over PCI bus 28 via PCI interface 26A and thus used by processors 23A and 23B.

Latch 46, is provided to select test point Signals 50 for output to physical pins on FPGA 33 via Multiplexer 43. This allows selection of real time output of signals from Raster Controller 34 that can be used with a logic analyzer, oscilloscope or other device. Multiplexer 43 can also be controlled by an external pin connection to control the selection of internal nodes output to test point signals 50, the external pins can supply the multiplexer select signals, instead of or in addition to the select signals supplied from latch 46.

Figure 5:
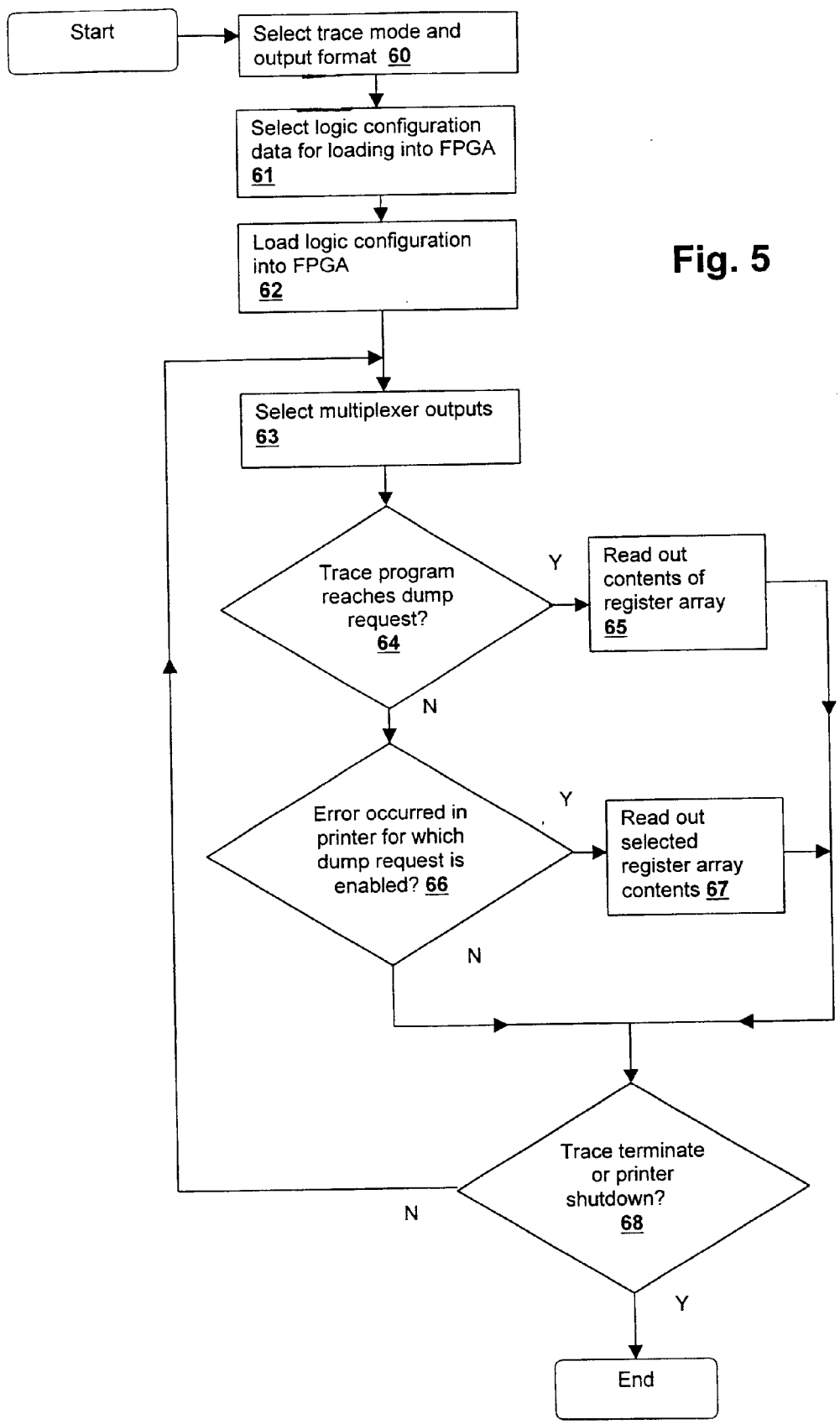
FIG. 5 is a flow diagram depicting a method for tracing hardware states using dynamically configurable test circuits, in accordance with a preferred embodiment of the invention.

Referring now to FIG. 5, there is illustrated a flow diagram of a method for tracing hardware states using dynamically reconfigurable test circuits in accordance with a preferred embodiment of the invention. This method is generally embodied in a software trace program running within printer 14.

A user or software program selects a trace format (debug level) for output (step 60). A logic configuration for FPGA 33 is selected in conformity with the trace format (step 61) and the logic configuration is loaded into FPGA 33 (step 62). Multiplexer outputs for external test points 37 are selected (step 63) to provide any external signals desired for debugging. When the trace program reaches a dump request (decision 64) the register array contents are read (step 65) and the trace program outputs them to a display or as a file, or network data. If during execution an error is detected by the trace program for which a dump request is enabled (decision 66), selected or all) register array contents are read (step 67) and output to a display or as a file or network data. The steps of multiplexer selection 63, and hardware tracing 64 and 66 are repeated until the trace program terminates or the printer is shut down (step 68).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method for tracing hardware states within a functional logic within a field programmable logic circuit using dynamically reconfigurable test circuits, said method comprising the steps of:

first selecting a test mode from a plurality of test modes for tracing the operation of said functional logic;

after said step of selecting a test mode, second selecting one of a plurality of configurations for said dynamically reconfigurable test circuits in conformity with said selected test mode;

configuring said field programmable logic circuit with said selected configuration to configure said dynamically configurable test circuits;

tracing execution of program code to create a software trace history by executing a test program;

periodically reading a set of registers within said dynamically reconfigurable test circuits to create a hardware trace log in response to the receipt of a hardware trace request during said tracing; and recording contents of said set of registers in synchronization with said software trace history to produce a full trace history.

2. The method according to claim 1, wherein said step of first selecting a test mode for tracing the operation of said functional logic further selects a format for output of said hardware trace log.

3. The method according to claim 1, wherein said method further comprises the step of detecting an error associated with said functional logic, and wherein said hardware trace request is made in response to said detected error.

4. The method according to claim 1, wherein said dynamically reconfigurable test circuits further comprise counters for counting transitions on internal signals within said functional logic, wherein said method further comprises the step of counting said transitions on internal signals, and wherein said step of periodically reading said set of registers further reads values of said counters.

5. The method according to claim 4, wherein said dynamically reconfigurable test circuits further comprise event detectors for detecting events occurring within said functional logic, wherein said method further comprises the step of detecting events occurring within said functional logic, and wherein said step of periodically reading said set of registers further reads values of said counters to determine the number of counts that have occurred between said events.

6. The method according to claim 5, wherein said event detectors are error detectors for detecting errors occurring within said functional logic and wherein said step of detecting events detects said errors.

7. The method according to claim 1, wherein said step of configuring said field programmable logic circuit includes writing data to said field programmable logic circuit over a peripheral bus.

8. The method according to claim 1, wherein said method further comprises the step selecting a plurality of nodes within said functional logic for output to external test pins on said field programmable logic circuit.

9. A system for controlling an electronic device, said system comprising:

a field programmable logic circuit in which functional logic and a plurality of dynamically reconfigurable test circuits are implemented, wherein said plurality of dynamically reconfigurable test circuits includes a register set;

a processor for executing program instructions to control said electronic device and for instantiating said plurality of dynamically reconfigurable test circuits by loading a selected of a plurality of configuration images into said field programmable logic circuit;

a storage for storing said plurality of configuration images for configuring said field programmable logic circuit and for storing a test program, said test program including:

instructions for tracing execution of program code to create a software trace history;

instructions for periodically reading a set of registers within said plurality of test circuits to create a hardware log in response to the receipt of a hardware trace request; and instructions for recording the contents of said registers in synchronization with said software trace history to produce a full trace history;

an interconnect coupling said field programmable logic circuit, said processor, and said storage.

10. The system in accordance with claim 9, wherein said processor configures said field programmable logic circuit with a test multiplexor having connections to external pins of said field programmable logic circuit for coupling signals within said functional logic to said external pins for measurement by external test equipment.

* * * * *